(12) United States Patent
Hou

(10) Patent No.: US 11,380,748 B2
(45) Date of Patent: Jul. 5, 2022

(54) ORGANIC LIGHT EMITTING DIODE DUAL SCREEN DISPLAY

(71) Applicant: SHENZHEN CHINA STAR OPTOELECTRONICS SEMICONDUCTOR DISPLAY TECHNOLOGY CO., LTD., Shenzhen (CN)

(72) Inventor: Jida Hou, Shenzhen (CN)

( * ) Notice: Subject to any disclaimer, the term of this patent is extended or adjusted under 35 U.S.C. 154(b) by 199 days.

(21) Appl. No.: 16/625,788

(22) PCT Filed: Dec. 5, 2019

(86) PCT No.: PCT/CN2019/123230
§ 371 (c)(1),
(2) Date: Dec. 23, 2019

(87) PCT Pub. No.: WO2021/103088
PCT Pub. Date: Jun. 3, 2021

(65) Prior Publication Data
US 2021/0335961 A1    Oct. 28, 2021

(30) Foreign Application Priority Data
Nov. 26, 2019    (CN) .......................... 201911175436.3

(51) Int. Cl.
*H01L 27/32*    (2006.01)
*H01L 25/065*    (2006.01)
*H01L 51/52*    (2006.01)
*H01L 51/00*    (2006.01)

(52) U.S. Cl.
CPC ...... *H01L 27/3267* (2013.01); *H01L 25/0657* (2013.01); *H01L 27/3276* (2013.01); *H01L 51/5284* (2013.01); *H01L 27/322* (2013.01); *H01L 51/0096* (2013.01)

(58) Field of Classification Search
CPC .................................................. H01L 27/3267
See application file for complete search history.

(56) References Cited

U.S. PATENT DOCUMENTS

| | | | |
|---|---|---|---|
| 2007/0131944 A1 | 6/2007 | Hu et al. | |
| 2016/0329381 A1 | 11/2016 | Xu et al. | |
| 2016/0343791 A1 | 11/2016 | Liu et al. | |
| 2018/0212013 A1* | 7/2018 | Sun | H01L 51/5253 |
| 2019/0181199 A1* | 6/2019 | Choi | H01L 27/3258 |

FOREIGN PATENT DOCUMENTS

| | | | |
|---|---|---|---|
| CN | 1805634 A | 7/2006 | |
| CN | 1809234 A | 7/2006 | |
| CN | 1867217 A | 11/2006 | |
| CN | 1874624 A | 12/2006 | |
| CN | 1905767 A | 1/2007 | |

(Continued)

*Primary Examiner* — Yu-Hsi D Sun

(57) ABSTRACT

An organic light emitting diode (OLED) dual screen display is provided, including a first OLED display panel and a second OLED display panel opposite to the first OLED display panel. Both edges of the first OLED display panel and both edges of the second OLED display panel are adhered by a sealant. Both the first OLED display panel and the second OLED display panel include an open area and a non-open area, and the non-open area is provided with a black matrix.

4 Claims, 2 Drawing Sheets

(56) References Cited

FOREIGN PATENT DOCUMENTS

| | | |
|---|---|---|
| CN | 1921142 A | 2/2007 |
| CN | 102593149 A | 7/2012 |
| CN | 104576697 A | 4/2015 |
| CN | 204271085 U | 4/2015 |
| CN | 104765157 A | 7/2015 |
| CN | 109461744 A | 3/2019 |
| CN | 110071144 A | 7/2019 |
| CN | 110085126 A | 8/2019 |
| CN | 110148356 A | 8/2019 |
| CN | 110265436 A | 9/2019 |
| JP | 2004265752 A | 9/2004 |

* cited by examiner

ORGANIC LIGHT EMITTING DIODE DUAL SCREEN DISPLAY

FIELD OF DISCLOSURE

The present disclosure relates to the field of display technologies, and in particular, to an organic light emitting diode (OLED) dual screen display.

BACKGROUND

Dual screen displays have broad application prospects in the fields of commodity displays, electronic bulletin boards, and high-end exhibitions. Conventional liquid crystal displays (LCDs) dual screen technology is implemented by two LCD display panels laminated back to back. Both display panels need respective backlights, and there is a need for a design of heat dissipation, so that the manufactured dual screen display will have a large thickness and occupy space to affect a look-and-feel, and the process is complicated and a yield is low, so a production cost is high.

In comparison to LCDs, organic light emitting diode (OLED) displays do not require a separate backlight and have self-luminous characteristics. With very thin coatings of organic materials and glass substrates, these organic materials emit light when current is passed through them. Also, the OLED displays can be made lighter and thinner, with a larger viewing angles, and can significantly save power. On the other hand, due to the self-emission of OLED, its low power consumption can further reduce the need for heat dissipation mechanism design, which is more suitable for the design of dual screen displays. At present, the design of a general OLED dual screen display is realized by bonding two OLED backplanes back-to-back. However, this design requires two independent OLED panels, resulting in a thicker display, a more complex structure and process, and higher manufacturing costs, which do not meet requirements of consumers for thinness and high cost performance.

Accordingly, the existing OLED dual screen display combines two independent OLED backplanes back-to-back to achieve dual screen display, resulting in a thicker display, a more complex structure and process, and higher production costs, which do not meet requirements of consumers for thinness and high cost performance.

SUMMARY OF DISCLOSURE

The existing OLED dual screen display combines two independent OLED backplanes back-to-back to achieve dual screen display, resulting in a thicker display, a more complex structure and process, and higher production costs, which do not meet requirements of consumers for thinness and high cost performance.

An embodiment of the present disclosure provides an OLED dual screen display, including a first OLED display panel and a second OLED display panel opposite to the first OLED display panel. Both edges of the first OLED display panel and both edges of the second OLED display panel are adhered by a sealant.

Both the first OLED display panel and the second OLED display panel include an open area and a non-open area, and the non-open area is provided with a black matrix.

In some embodiments, the first OLED display panel includes a first substrate, a first thin film transistor (TFT) array layer, a first OLED organic light emitting layer, a first cathode layer, a first color filter layer, the TFT array layer is disposed on the first substrate near the second OLED display panel, and first color filter layer is disposed on the first substrate or a second substrate. The second OLED display panel includes a second substrate, a second TFT array layer, a second OLED organic light emitting layer, a second cathode layer, and a second color filter layer, the second TFT array layer is disposed on the second substrate near the first OLED display panel, and the second color filter layer is disposed on the first substrate or the second substrate.

In some embodiments, the first OLED display panel includes a plurality of first scan lines and a plurality of first data lines, the plurality of first data lines extend in a first direction d1, and the plurality of first scan lines extend in a second direction d2. The second OLED display panel includes a plurality of second scan lines and a plurality of second data lines, the plurality of second scan lines extend in the second direction d2, and the plurality of second data lines extend in the first direction d1.

In some embodiments, each of the first scan lines and each of the second scan lines are alternatively arranged along the second direction d2, and each of the first data lines and each of the second data lines are alternatively arranged along the first direction d1.

In some embodiments, in response to the OLED dual screen display being a bottom-emitting structure, the first TFT array layer, the first OLED organic light emitting layer, and the first cathode layer are stacked on an upper surface of the first substrate from bottom to top, and the first color filter layer is disposed in the first TFT array layer or below the first TFT array layer. The second TFT array layer, the second OLED organic light emitting layer, and the second cathode layer are stacked on a surface of the second substrate near the first substrate from top to bottom, and the second color filter layer is disposed in the second TFT array layer or above the second TFT array layer.

In some embodiments, in response to the OLED dual screen display being a top-emitting structure, the first TFT array layer, the first OLED organic light emitting layer, and the first cathode layer are stacked on an upper surface of the first substrate from bottom to top, and the first cathode layer corresponds to the first color filter layer on the second substrate. The second TFT array layer, the second OLED organic light emitting layer, and the second cathode layer are stacked on a surface of the second substrate near the first substrate from top to bottom, and the second cathode layer corresponds to the second color filter layer on the first substrate.

In some embodiments, both the first substrate and the second substrate are formed by one or a combination of transparent polyimide, polyetherimide, and polyphenylene sulfide.

In some embodiments, both the first TFT array layer and the second TFT array layer each include an active layer, a gate, and a source and drain layer, and the source and drain layer includes a two-layer composite film structure.

In some embodiments, material of the first cathode layer and material of the second cathode layer are metal materials, and the material of the first cathode layer and the material of the second cathode layer are the same metal material or different metal materials.

In some embodiments, in response to the OLED dual screen display being a bottom-emitting structure, a light emitting direction of the first OLED display panel is far from a side of the second OLED display panel, and a light emitting direction of the second OLED display panel is opposite to that of the first OLED display panel. In response to the OLED dual screen display being a top-emitting structure, the light emitting direction of the first OLED display panel is close to a side of the second OLED display panel, and the light emitting direction of the second OLED display panel is opposite to that of the first OLED display panel.

In comparison with the prior art, in the OLED dual screen display provided in the embodiments of the present disclosure, the two edges of the two OLED display panels are adhered together through the sealant, and the non-open area is filled with the black matrix. Therefore, not only the dual screen display is realized, but a production cost is further reduced.

DETAILED DESCRIPTION

The present disclosure provides an OLED dual screen display. In order to make the purpose of the present disclosure, the technical solution, and effects are clearer, the present disclosure is further described in detail below with reference to the accompanying drawings and embodiments. It should be understood that the specific embodiments described herein are only used to explain the present disclosure, and are not used to limit the present disclosure.

Figure 1:
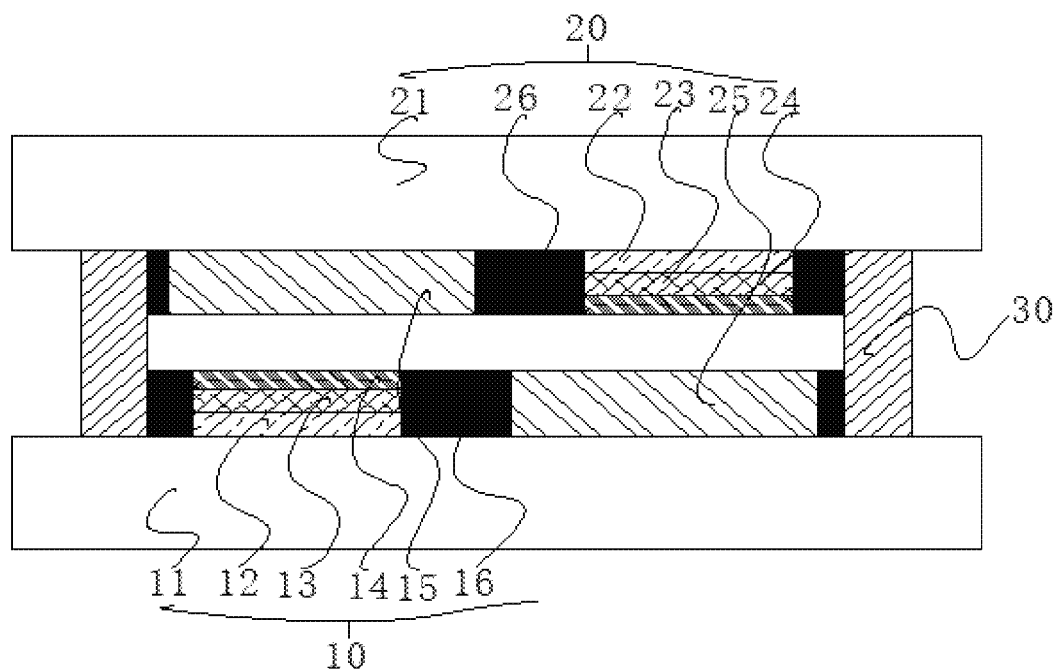
FIG. 1 is a cross-sectional view of an OLED dual screen display according to a first embodiment of the present disclosure.

FIG. 1 is a cross-sectional view of an OLED dual screen display according to a first embodiment of the present disclosure. The OLED dual screen display of the first embodiment is a top-emitting structure.

Specifically, the OLED dual screen display includes a first OLED display panel 10 and a second OLED display panel 20 opposite to the first OLED display panel 10. Both edges of the first OLED display panel 10 and both edges of the second OLED display panel 20 are adhered by a sealant 30. Both the first OLED display panel and the second OLED display panel include an open area and a non-open area, and the non-open area is provided with a black matrix.

Specifically, the first OLED display panel 10 includes a first substrate 11, a first thin film transistor (TFT) array layer 12, a first OLED organic light emitting layer 13, a first cathode layer 14, a first color filter layer 15. The TFT array layer 12 is disposed on the first substrate 11 near the second OLED display panel 20. The first cathode layer 14 corresponds to the first color filter layer 15 on a second substrate 21, and the first cathode layer 14 has a semi-transparent cathode structure.

The second OLED display panel 20 includes a second substrate 21, a second TFT array layer 22, a second OLED organic light emitting layer 23, a second cathode layer 24, and a second color filter layer 25. The second TFT array layer 22 is disposed on the second substrate 21 near the first OLED display panel 12. The second cathode layer 24 corresponds to the second color filter layer 25 on the first substrate 11.

Preferably, a first black matrix 16 is provided on a non-open area of the first OLED display panel 10, and a second black matrix 26 is provided on a non-open area of the second OLED display panel 20.

Preferably, both the first substrate 11 and the second substrate 12 are formed by one or a combination of transparent polyimide, polyetherimide, and polyphenylene sulfide.

Preferably, both the first TFT array layer 11 and the second TFT array layer 21 include a plurality of thin film transistors arranged in an array. The thin film transistor includes an active layer, a gate, and a source and drain layer. The source and drain layer is a two-layer composite film structure. When the thin film transistor operates, corresponding top-emitting sub-pixels are controlled to be turned on or off.

Preferably, both the first TFT array layer 11 and the second TFT array layer 21 include an anode metal layer. The anode metal layer is a reflective anode structure. Material of the reflective anode structure is preferably MoAlNd.

Preferably, the first OLED light emitting layer 13 and the second OLED light emitting layer 23 are both made of white light emitting materials.

Specifically, material of the first cathode layer 14 and material of the second cathode layer 24 are both semi-transparent materials. The material of the first cathode layer 14 and the material of the second cathode layer 24 are metal materials. The material of the first cathode layer 14 and the material of the second cathode layer 24 are the same metal material or different metal materials, and the metal material is preferably aluminum or silver.

Specifically, both the first color filter layer 15 and the second color filter layer 25 include a red block, a green block, and a blue block.

In the OLED dual screen display of the first embodiment of the present disclosure, the first TFT array layer 12, the first OLED organic light emitting layer 13, the first reflective cathode layer 14, and the first color filter layer 15 of the first OLED display panel 10 constitute a sub-pixel. The second TFT array layer 22, the second OLED organic light emitting layer 23, the second reflective cathode layer 24, and the second color filter layer 25 of the second OLED display panel 20 constitute another sub-pixel. Therefore, the OLED dual screen display achieves a double-sided display.

A light emitting direction of the first OLED display panel 10 is close to one side of the second OLED display panel 20, that is, it faces the second substrate 21. Specifically, the light emitted by the first OLED organic light emitting layer 13 is reflected by a reflective anode of the first substrate 11 and passes through the semi-transparent first cathode layer 14 to the first color filter layer 15 and is finally emitted through a top surface of the second substrate 21.

A light emitting direction of the second OLED display panel 20 is opposite to that of the first OLED display panel 10, that is, the light emitting direction of the second OLED display panel 20 is toward the first substrate 11. Specifically, the light emitted by the second OLED organic light emitting layer 23 is reflected by a reflective anode of the second substrate 21, and reaches the second color filter layer 25 through the semi-transparent second cathode layer 24, and is finally emitted through a bottom surface of the first substrate 11.

Figure 2:
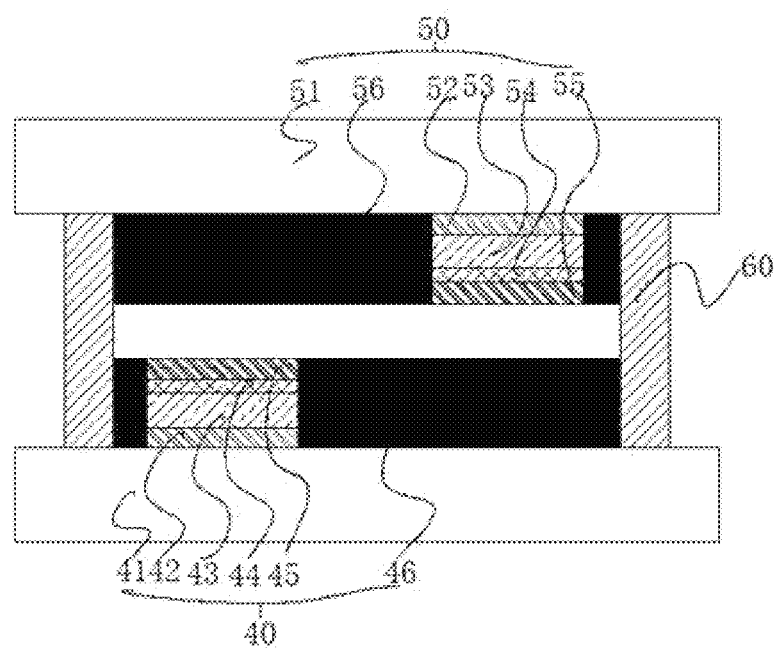
FIG. 2 is a cross-sectional view of an OLED dual screen display according to a second embodiment of the present disclosure.

As shown in FIG. 2, an embodiment of the present disclosure also provides another structure of an OLED dual screen display. A second embodiment of the OLED dual screen display is a bottom-emitting structure. A first OLED display panel 40 and a second OLED display panel 50 are both non-color filter on array (COA) substrates.

Specifically, the OLED dual screen display includes the first OLED display panel 40 and the second OLED display panel 50 opposite to the first OLED display panel 40. Both edges of the first OLED display panel 40 and both edges of the second OLED display panel 50 are adhered by a sealant 60. Both the first OLED display panel 40 and the second OLED display panel 50 include an open area and a non-open area, and the non-open area is provided with a black matrix.

Specifically, the first OLED display panel 40 includes a first substrate 41, a first color filter layer 42, a first thin film transistor (TFT) array layer 43, a first OLED organic light emitting layer 44, a first reflective cathode layer 45. The first color filter layer 42 is disposed on the first substrate 41 near the second OLED display panel 50. The second OLED display panel 50 includes a second substrate 51, a second color filter layer 52, a second TFT array layer 53, a second OLED organic light emitting layer 54, a second reflective cathode layer 55. The second color filter layer 52 is disposed on the second substrate 51 near the first OLED display panel 40. The first color filter layer 42, the first TFT array layer 43, the first OLED organic light emitting layer 44, and the first reflective cathode layer 45 are stacked on the first substrate 11 from bottom to top. The first reflective cathode layer 45 corresponds to a portion of the black matrix on the second substrate 51. The second color filter layer 52, the second TFT array layer 53, the second OLED organic light emitting layer 54, and the second reflective cathode layer 55 are stacked on a surface of the second substrate 51 near the first substrate 41 from top to bottom. The second reflective cathode layer 55 corresponds to a portion of the black matrix on the first substrate 41.

Preferably, the first OLED display panel 40 and the second OLED display panel 50 are COA substrates. That is, the first color filter layer 42 is disposed in the first TFT array layer 43 and the second color filter layer 52 is disposed in the second TFT array layer 53 (not shown in FIG. 2).

Preferably, a first black matrix 46 is provided on a non-open area of the first OLED display panel 40, and a second black matrix 56 is provided on a non-open area of the second OLED display panel 50.

Preferably, both the first substrate 41 and the second substrate 51 are formed by one or a combination of at least two of transparent polyimide, polyetherimide, and polyphenylene sulfide.

Specifically, both the first color filter layer 42 and the second color filter layer 52 include a red block, a green block, and a blue block.

Preferably, the first TFT array layer 43 and the second TFT array layer 53 include a plurality of thin film transistors (TFTs) arranged in an array. The thin film transistor includes an active layer, a gate, a source and drain layer. The source and drain layer is a two-layer composite film structure. When the thin film transistor operates, corresponding bottom-emitting sub-pixels are controlled to be turned on or off.

Preferably, the first TFT array layer 11 and the second TFT array layer 21 include an anode metal layer. Material of the anode metal layer is a transparent anode type material, and material of the anode metal layer is preferably indium tin oxide (ITO).

Preferably, both the first OLED organic light emitting layer 44 and the second OLED organic light emitting layer 54 are made of white light emitting materials.

Material of the first cathode layer 45 and material of the second cathode layer 55 are both reflective materials. Specifically, the material of the first cathode layer 45 and the material of the second cathode layer 55 are metal materials. The material of the first reflective cathode layer 45 and the material of the second reflective cathode layer 55 are the same metal material or different metal materials, and the metal material is preferably silver or a silver alloy.

In the OLED dual screen display of the second embodiment of the present disclosure, first color filter layer 42, the first TFT array layer 43, the first OLED organic light emitting layer 44, and the first cathode layer 45 of the first OLED display panel 40 constitute a sub-pixel. The second color filter layer 52, the second TFT array layer 53, the second OLED organic light emitting layer 54, and the second cathode layer 55 of the second OLED display panel 50 constitute another sub-pixel. Therefore, the OLED dual screen display achieves a double-sided display.

Specifically, a light emitting direction of the first OLED display panel 40 is far from a side of the second OLED display panel 50, that is, the side far from a lower surface of the first substrate 41. The light emitting direction of the second OLED display panel 50 is opposite to that of the first OLED display panel 40. The light emitted by the first OLED organic light emitting layer 44 is reflected by the first cathode layer 45, reaches the first color filter layer 42 through a transparent anode metal layer, and is finally emitted through a bottom surface of the first substrate 41. The light emitted by the second OLED organic light emitting layer 54 is reflected by the second cathode layer 55, passes through a transparent anode metal layer, reaches the second color filter layer 52, and is finally emitted through a top surface of the second substrate 51.

Figure 3:
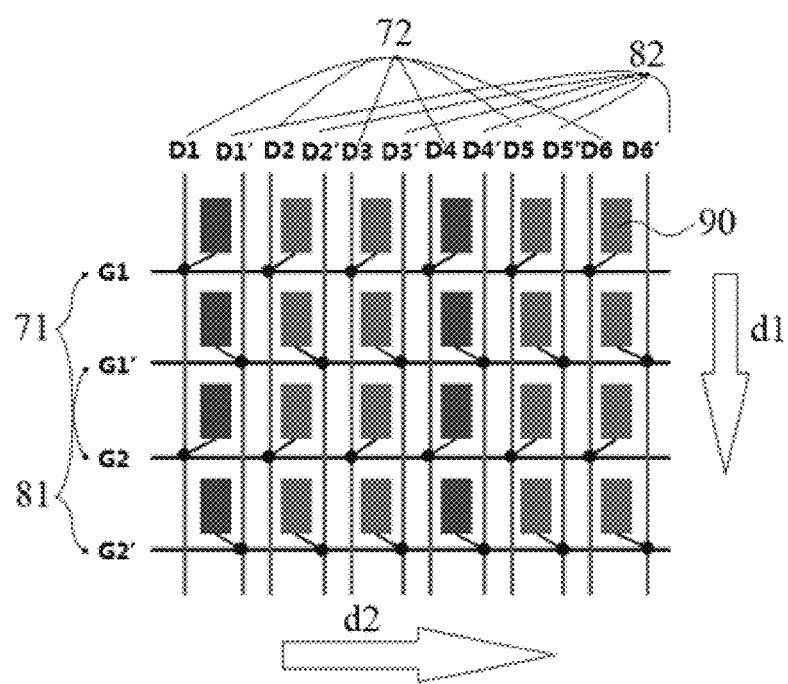
FIG. 3 is a schematic diagram of a pixel arrangement and signal lines of an OLED dual screen display according to an embodiment of the present disclosure.

FIG. 3 is a schematic diagram of a pixel arrangement and signal lines of an OLED dual screen display according to an embodiment of the present disclosure. The OLED dual screen display includes a plurality of scan lines, a plurality of data lines, and a plurality of sub-pixels 90 disposed at each intersection of the plurality of scan lines and the plurality of data lines. The first OLED display panel includes a plurality of first scan lines 71 and a plurality of first data lines 72. The plurality of first data lines 72 extend in a first direction d1, and the plurality of first scan lines 71 extend in a second direction d2. The second OLED display panel includes a plurality of second scan lines 81 and a plurality of second data lines 82. The plurality of second scan lines 81 extend in the second direction d2, and the plurality of second data lines 82 extend in the first direction d1.

Specifically, the first direction d1 is perpendicular to the second direction d2.

Specifically, each of the first scan lines 71 and each of the second scan lines 81 are alternatively arranged along the second direction d2, and each of the first data lines 72 and each of the second data lines 82 are alternatively arranged along the first direction d1.

The OLED dual screen displays provided in the embodiments of the present disclosure can reduce production costs, have a design sense, and can be applied to the fields of commodity displays, electronic bulletin boards, high-end exhibitions, and the like.

In summary, in the OLED dual screen displays provided in the embodiments of the present disclosure, the two edges of the two OLED display panels are adhered through the sealant, and the non-open area is filled with the black matrix. Therefore, not only the dual screen display is realized, but a production cost is further reduced.

It can be understood that for a person of ordinary skill in the art, equivalent replacements or changes can be made according to the technical solution of the present disclosure and its inventive concept, and all these changes or replacements shall fall within the protection scope of the claims appended to the present disclosure.

What is claimed is:

1. An organic light emitting diode (OLED) dual screen display, comprising a first OLED display panel and a second OLED display panel opposite to the first OLED display panel, wherein both edges of the first OLED display panel and both edges of the second OLED display panel are adhered by a sealant; and wherein both the first OLED display panel and the second OLED display panel comprise an open area and a non-open area, and the non-open area is provided with a black matrix;

wherein the first OLED display panel comprises a first substrate, a first thin film transistor (TFT) array layer, a first OLED organic light emitting layer, a first cathode layer, a first color filter layer, the TFT array layer is disposed on the first substrate near the second OLED display panel, and first color filter layer is disposed on the first substrate or a second substrate;

the second OLED display panel comprises a second substrate, a second TFT array layer, a second OLED organic light emitting layer, a second cathode layer, and a second color filter layer, the second TFT array layer is disposed on the second substrate near the first OLED display panel, and the second color filter layer is disposed on the first substrate or the second substrate;

wherein the first OLED display panel comprises a plurality of first scan lines and a plurality of first data lines, the plurality of first data lines extend in a first direction d1, and the plurality of first scan lines extend in a second direction d2;

the second OLED display panel comprises a plurality of second scan lines and a plurality of second data lines, the plurality of second scan lines extend in the second direction d2, and the plurality of second data lines extend in the first direction d1;

wherein each of the first scan lines and each of the second scan lines are alternatively arranged along the second direction d2, and each of the first data lines and each of the second data lines are alternatively arranged along the first direction d1;

wherein in response to the OLED dual screen display being a top-emitting structure, the first TFT array layer, the first OLED organic light emitting layer, and the first cathode layer are stacked on an upper surface of the first substrate from bottom to top, and the first cathode layer corresponds to the first color filter layer on the second substrate; and the second TFT array layer, the second OLED organic light emitting layer, and the second cathode layer are stacked on a surface of the second substrate near the first substrate from top to bottom, and the second cathode layer corresponds to the second color filter layer on the first substrate.

2. The OLED dual screen display as claimed in claim 1, wherein both the first substrate and the second substrate are formed by one or a combination of transparent polyimide, polyetherimide, and polyphenylene sulfide.

3. The OLED dual screen display as claimed in claim 1, wherein both the first TFT array layer and the second TFT array layer each comprise an active layer, a gate, and a source and drain layer, and the source and drain layer comprises a two-layer composite film structure.

4. The OLED dual screen display as claimed in claim 1, wherein material of the first cathode layer and material of the second cathode layer are metal materials, and the material of the first cathode layer and the material of the second cathode layer are the same metal material or different metal materials.

* * * * *